(12) United States Patent
Fujikata et al.

(10) Patent No.: US 8,873,895 B2
(45) Date of Patent: Oct. 28, 2014

(54) OPTICAL MODULATOR (75) Inventors: Junichi Fujikata, Tokyo (JP);
Motofumi Saitoh, Tokyo (JP); Jun Ushida, Tokyo (JP); Akio Toda, Tokyo (JP)

(73) Assignee: NEC Corporation, Tokyo (JP)

( * ) Notice: Subject to any disclaimer, the term of this patent is extended or adjusted under 35 U.S.C. 154(b) by 175 days.

(21) Appl. No.: 13/582,841

(22) PCT Filed: Mar. 1, 2011

(86) PCT No.: PCT/JP2011/054563
§ 371 (c)(1),
(2), (4) Date: Oct. 11, 2012

(87) PCT Pub. No.: WO2011/108508
PCT Pub. Date: Sep. 9, 2011

(65) Prior Publication Data
US 2013/0064491 A1  Mar. 14, 2013

(30) Foreign Application Priority Data
Mar. 5, 2010  (JP) .................................. 2010-049175

(51) Int. Cl.
G02F 1/035 (2006.01)
H01L 21/02 (2006.01)

(52) U.S. Cl.
CPC ............... G02F 1/035 (2013.01); H01L 21/02 (2013.01)
USPC ............ 385/2; 385/1; 385/3; 385/14; 385/15; 385/147

(58) Field of Classification Search
USPC .................... 385/1, 2, 3, 14, 15, 147
See application file for complete search history.

(56) References Cited

U.S. PATENT DOCUMENTS

| 6,757,091 B1 | 6/2004 | Nicolaescu et al. |
| 7,034,981 B2 * | 4/2006 | Makigaki ...................... 359/290 |
| 7,324,258 B2 * | 1/2008 | Kwon et al. ................... 359/248 |
| 2004/0213497 A1 | 10/2004 | Liu |
| 2005/0189591 A1 | 9/2005 | Gothoskar et al. |

FOREIGN PATENT DOCUMENTS

| JP | 03-196120 | 8/1991 |
| JP | 2006-515082 | 5/2006 |
| JP | 2007-525711 | 9/2007 |
| JP | 2009-258527 | 11/2009 |

OTHER PUBLICATIONS

International Search Report, PCT/JP2011/054563, May 17, 2011.
Green et al., "Ultra-compact, low RF power, 10 Gb/s silicon Mach-Zehnder modulator", Dec. 10, 2007/ vol. 15, No. 25/ Optics Express 17106.

* cited by examiner

*Primary Examiner* — Jennifer Doan
(74) *Attorney, Agent, or Firm* — Young & Thompson (57) ABSTRACT To provide an optical modulator having a reduced size and reduced power consumption and capable of being easily connected to a waveguide and a method of manufacturing the optical modulator. The optical modulator has at least semiconductor layer (8) having a rib-shaped portion and doped so as to be of a first conduction type, dielectric layer (11) laid on first-conduction-type semiconductor layer (8), and semiconductor layer (9) laid on dielectric layer (11), having the width at the side opposite from dielectric layer (11) increased relative to the width of the rib-shaped portion, and doped so as to be of a second conduction type.

14 Claims, 7 Drawing Sheets

OPTICAL MODULATOR

TECHNICAL FIELD

The present invention relates to an optical modulator that converts into an optical signal a high-speed electrical signal required in the information processing and communication field and to a method of manufacturing the optical modulator. More particularly, the present invention relates to an optical modulator that uses a silicon-insulator-silicon capacitor structure formed on a SOI (Silicon on Insulator) substrate and to a method of manufacturing the optical modulator.

BACKGROUND ART

Optical fiber communication that has been mainly for business use is also becoming widespread for home use. With this movement, there is a demand for a high-performance optical communication device. As optical communication devices for various optical communication systems including optical fibers for home use and local area networks (LAN), silicon-based optical communication devices capable of functioning at optical signal wavelengths of 1330 and 1500 nm exist. The silicon-based optical communication devices are highly promising and, more specifically, can have an optical function element and an electronic circuit integrated on a silicon platform by using a CMOS (Complementary Metal Oxide Semiconductor) technique.

As silicon-based optical communication devices, passive devices such as waveguides, optical couplers and wavelength filters are being widely studied. Also, active devices such as silicon-based optical modulators and optical switches are important elements in optical signal operating means for the above-mentioned optical communication systems, and are attracting a great deal of attention. Optical modulators and optical switches capable of changing the refractive index by a thermo-optic effect of silicon operate only at low optical modulation rates and, therefore, can be used only in apparatuses in which the optical modulation frequency is 1 Mb/sec or lower. An optical modulator using an electro-optic effect is required for apparatuses in which the optical modulation frequency is higher than this value.

No change due to the Pockels effect is observed in the refractive index of pure silicon, and a change in refractive index of pure silicon due to the Franz-Keldysh effect or the Kerr effect is extremely small. Therefore, many of the optical modulators presently proposed and using electro-optic effects use a carrier plasma effect. That is, to change the phase or the intensity of light, the real and imaginary parts of the refractive index are changed by changing the free carrier density in a silicon layer. In an optical modulator using free carrier absorption, the output is directly modulated by changes in absorption of light propagating through silicon. In structures using changes in refractive index, a Mach-Zehnder interferometer is ordinarily used. A light intensity modulation signal can be obtained by causing interference between phase differences in two arms.

The free carrier density in optical modulators can be changed by injection, accumulation, removal or inversion of free carriers. Many of such optical modulators studied heretofore have low optical modulation efficiency and a length of 1 mm or more necessary for optical phase modulation and need an injection current density higher than 1 kA/cm$^3$. Realizing a reduction in size, a high degree of integration, and a reduction in power consumption of an optical modulator requires a device structure capable of obtaining high optical modulation efficiency. The realization of a device structure capable of obtaining high optical modulation efficiency enables reducing the length necessary for optical phase modulation. In a case where the size of an optical communication device is large, the device is vulnerable to the influence of temperature on the silicon substrate and the electro-optic effect to be obtained may be cancelled out by a change in refractive index of the silicon layer due to a thermo-optic effect.

Figure 1:
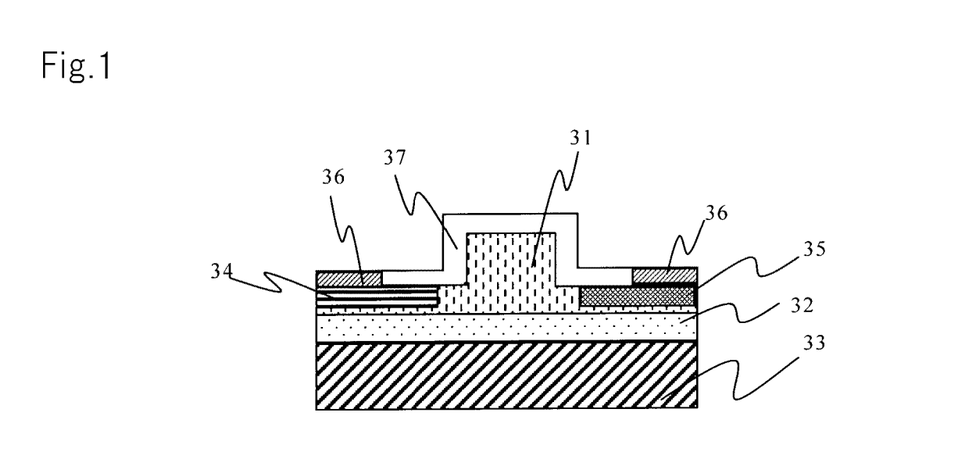
FIG. 1 is a schematic construction diagram of an example of an optical modulator according to the related art.

FIG. 1 shows an example of related art for a silicon-based optical modulator using a rib waveguide formed on a SOI (Silicon on Insulator) substrate. Buried oxide layer 32 and intrinsic semiconductor 31 including a rib-shaped portion are successively laid on substrate 33. On opposite sides of the rib-shaped portion of intrinsic semiconductor 31, p+ doped semiconductor 34 and n+ doped semiconductor 35 are respectively formed at certain distances therefrom. Each of p+ doped semiconductor 34 and n+ doped semiconductor 35 is formed by performing high-concentration doping of portions of intrinsic semiconductor 31. The structure of the optical modulator shown in FIG. 1 is a PIN (P-intrinsic-N) diode. When forward and reverse bias voltages are applied to the PIN diode, the free carrier density in intrinsic semiconductor 31 is changed and the refractive index is changed by a carrier plasma effect. In this example, electrode contact layer 36 is disposed on one side of the rib-shaped portion of intrinsic semiconductor 31, and p+ doped semiconductor 34 mentioned above is formed at a position opposite from electrode contact layer 36. Similarly, another electrode contact layer 36 is formed on the other side of the rib-shaped portion of intrinsic semiconductor 31, and n+ doped semiconductor 35 is formed at a position opposite from electrode contact layer 36. The waveguide including the rib-shaped portion is covered with oxide cladding 37. In the above-described PIN diode structure, high-concentration doping can be performed so that the carrier densities in semiconductors 34 and 35 are about 10$^{20}$/cm$^3$.

When an optical modulation operation is performed, a forward bias voltage is applied to the PIN diode from a power supply connected to electrode contact layer 36 to inject free carriers into the waveguide. At this time, with the increase of free carriers, the refractive index of intrinsic semiconductor 31 is changed, thereby performing phase modulation of light propagated through the waveguide. However, the speed of this optical modulation operation is limited by the lifetime of free carriers in the rib-shaped portion of intrinsic semiconductor 31 and by carrier diffusion when the forward bias voltage is removed. The optical modulator that has the PIN diode structure according to this related art ordinarily has an operating speed in the range from 10 Mb/sec to 50 Mb/sec when a forward bias voltage is applied. An impurity may be introduced into intrinsic semiconductor 31 in order to reduce the carrier lifetime. This enables increasing the switching speed. However, there is a problem in which the introduced impurity will cause a reduction in optical modulation efficiency. Also, the dominant factor that influences the operating speed is RC time constant. With reduction of the carrier depletion layer in the PN (Positive-Negative) junction, the electrostatic capacity at the time of application of a forward bias voltage becomes considerably large. Theoretically, a high-speed operation of the PN junction can be achieved by applying a reverse bias voltage. However, a comparatively high drive voltage or a large element size is required.

Figure 2:
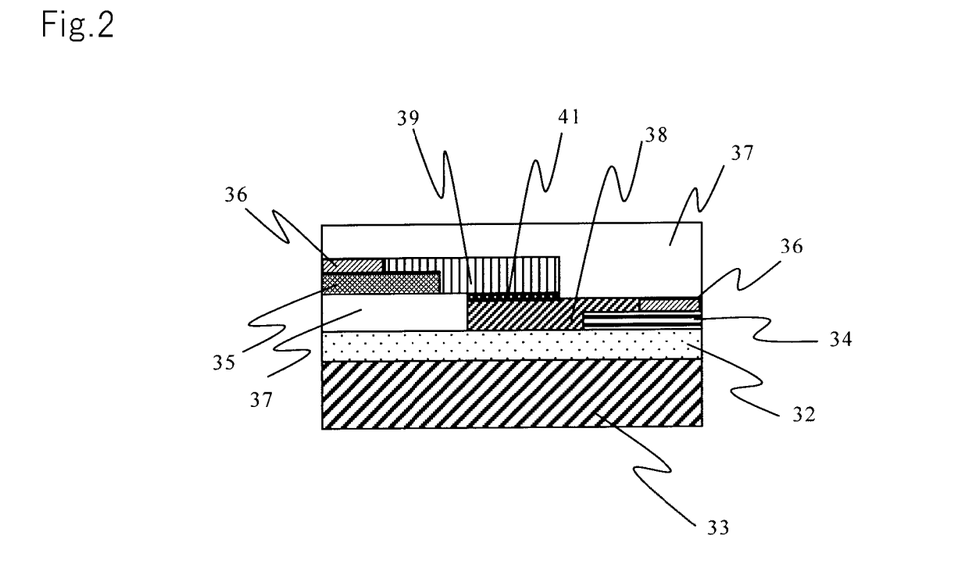
FIG. 2 is a schematic construction diagram of another example of an optical modulator of the related art.

Another example of related art is a silicon-based optical modulator disclosed in patent literature 1. This optical modulator has a capacitor structure in which buried oxide layer 32 and the main body region of a first conduction type are successively laid on substrate 33; the gate region of a second conduction type is laid so as to partly overlap the main body region; and thin dielectric layer 41 is formed at the layer interface between the main body region and the gate region. In the following description, "thin" denotes submicron order (smaller than 1 μm).

FIG. 2 shows a silicon-based optical modulator formed of a SIS (silicon-insulator-silicon) structure according to the related art. The optical modulator is formed on a SOI substrate constituted by substrate 33, buried oxide layer 32 and a main body region. The main body region is constituted by p doped semiconductor 38 formed by doping the silicon layer in the SOI substrate, p+ doped semiconductor 34 formed by high-concentration doping, and electrode contact layer 36. A gate region is constituted by n doped semiconductor 39 formed by doping a thin silicon layer laid on the SOI substrate, n+ doped semiconductor 35 formed by high-concentration doping, and electrode contact layer 36. Oxide cladding 37 is provided in the gap between buried oxide layer 32 and the main and gate regions, and above the main and gate regions.

Change of the carrier density in the doped regions is controlled by means of an external signal voltage. Also, when a voltage is applied to electrode contact layers 36, free carriers are accumulated, removed or inverted on the opposite sides of dielectric layer 41. Optical phase modulation is performed thereby. Therefore it is desirable that the optical signal electric field region and the region in which the carrier density is dynamically controlled from the outside coincide with each other.

CITATION LIST

Patent Literature

Patent Literature 1: JP2006-515082A

SUMMARY OF INVENTION

Technical Problem

In the method in patent literature 1, optical phase modulation can be performed. In actuality, however, the thickness of the region in which the carrier density is dynamically changed is very small, about several ten nanometers. Therefore an optical modulation length on the millimeter order (equal to or larger than 1 mm) is required, the size of the optical modulator is also increased and it is difficult to perform a high-speed operation. Also, because of the structure that provides the gate region provided on the SOI substrate, it is difficult to make a optical coupling to the silicon waveguides formed of the SOI layer that is formed on the front and rear sides of the optical modulator. It is necessary to form a spot size converter structure or the like in order to match the light field size, and there is a problem in which optical loss and manufacturing costs increase.

It is, therefore, difficult to realize, as an optical modulator in a category of silicon-based optical modulators that are capable of being integrated on a silicon substrate, an optical modulator based on the carrier plasma effect and that is capable of realizing low cost, low current density, low power consumption, a high degree of modulation, low-voltage drive and high-speed modulation in a region of a thickness of the submicron order (smaller than 1 μm).

An object of the present invention is to provide an optical modulator and a method of manufacturing the optical modulator as a solution to the problem that it is difficult to reduce the size and power consumption of an optical modulator and to facilitate connection to a waveguide.

Solution to Problem

An optical modulator according to the present invention includes at least a semiconductor layer having a rib-shaped portion and doped so as to be of a first conduction type, a dielectric layer laid on the first-conduction-type semiconductor layer, and a semiconductor layer laid on the dielectric layer, having the width at the side opposite from the dielectric layer increased relative to the width of the rib-shaped portion, and doped so as to be of a second conduction type.

Advantageous Effects of Invention

According to the present invention, optical transmission loss is reduced and overlap between a light field and a carrier density modulation region is increased. Therefore the size of the optical modulator can be reduced and the facility with which a connection is made between the optical modulator and a waveguide is improved.

DESCRIPTION OF EMBODIMENTS

Exemplary embodiments of the present invention will be described with reference to the accompanying drawings. Components having the same functions are indicated by the same reference numerals in the drawings and the descriptions of them may be omitted.

A mechanism to modulate the carrier density in a silicon layer, which is the basis for the operation of the present invention, will be described before the description of an illustrative example of a structure for an optical modulator according to the present invention. A silicon-based optical modulator according to the present invention uses a carrier plasma effect described below.

No change due to the Pockels effect is observed in the refractive index of pure silicon, and a change in refractive index of pure silicon due to the Franz-Keldysh effect or the Kerr effect is extremely small, as described above. Therefore only a carrier plasma effect and a thermo-optic effect can be used for the optical modulation operation. However, the optical modulator in which the refractive index is changed by using a thermo-optic effect has a reduced modulation rate. Therefore, only carrier diffusion based on a carrier plasma effect is effective in performing a high-speed operation (at 1 Gb/sec or higher) that is to be realized by the present invention. A change in refractive index due to a carrier plasma effect can be explained with reference to a primary approximation of the following relation expression derived from Kramers-Kronig relation and Drude's equation.

$$\Delta n = -\frac{e^2\lambda^2}{8\pi^2 c^2 \varepsilon_0 n}\left(\frac{\Delta N_e}{m_e} + \frac{\Delta N_k}{m_k}\right) \quad \text{[Expression 1]}$$

$$\Delta k = -\frac{e^3\lambda^2}{8\pi^2 c^3 \varepsilon_0 n}\left(\frac{\Delta N_e}{m_e^2 \mu_e} + \frac{\Delta N_k}{m_k^2 \mu_k}\right) \quad \text{[Expression 2]}$$

$\Delta n$ and $\Delta k$ represent the real and imaginary parts of a change in the refractive index of a silicon layer. Also, e represents charge; $\lambda$, the wavelength of light; $\varepsilon_0$, the dielectric constant in vacuum; n, the refractive index of intrinsic silicon; $m_e$, the effective mass of electron carriers; $m_h$, the effective mass of hole carriers; $\mu_e$, the mobility of hole carriers; $\mu_h$, the mobility of hole carriers; $\Delta N_e$, a change in concentration of electron carriers; and $\Delta N_h$, a change in concentration of hole carriers. An experimental evaluation of a carrier plasma effect in silicon has been made and it has been found that changes in refractive index with respect to the carrier density at optical communication wavelengths of 1330 nm and 1500 nm that is used in the communication systems well match the results obtained by the above-described expression. Also, the amount of phase change in an optical modulator using a carrier plasma effect is defined by the following expression.

$$\Delta\theta = \frac{2\pi}{\lambda}\Delta n_{\mathit{eff}} L \quad \text{[Expression 3]}$$

L is the length of an active layer along the direction of propagation of light in the optical modulator.

In the present invention, the amount of phase change described above is a large effect in comparison with the light absorption effect, and optical modulators described below can basically show the features of a phase modulator.

An optical modulator that has a silicon-dielectric layer-silicon (SIS: silicon-insulator-silicon) capacitor structure on a SOI (Silicon on Insulator) substrate according to the present invention and that uses a free carrier plasma effect will be described below.

Figure 3A:
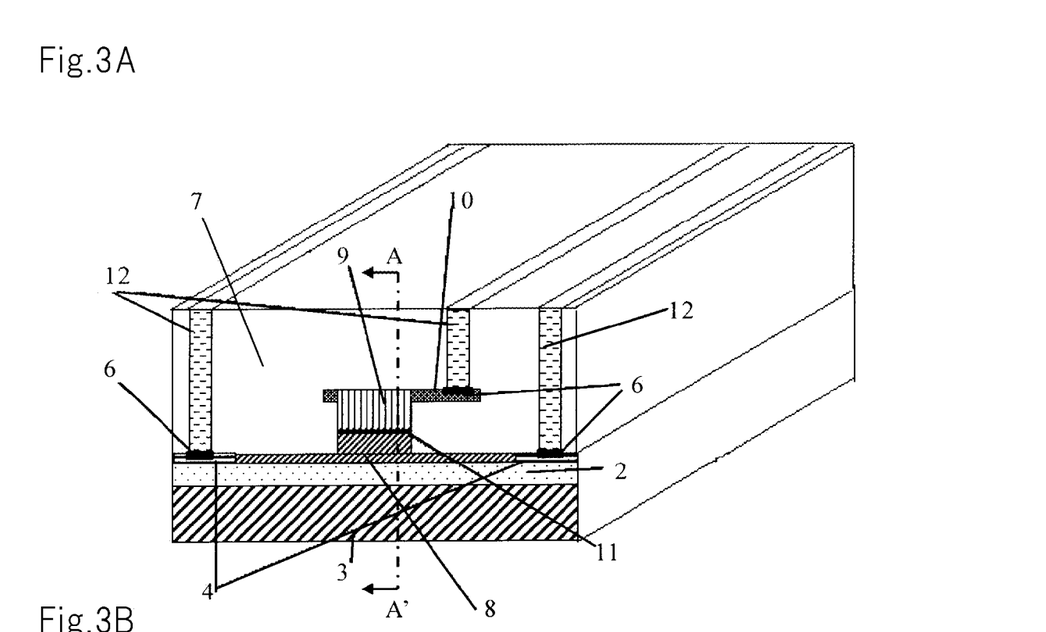
FIG. 3A is a schematic construction diagram of a first exemplary embodiment of an optical modulator according to the present invention, as viewed along the direction of propagation of light.
Figure 3B:
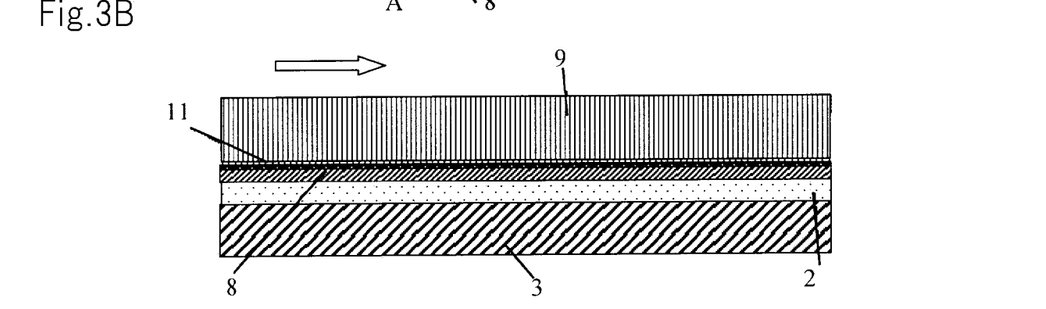
FIG. 3B is a schematic construction diagram in section taken along line AA' in FIG. 3A.

FIG. 3A is a schematic construction diagram of a first exemplary embodiment of an optical modulator according to the present invention, as viewed along the direction of propagation of light. FIG. 3B is a schematic construction diagram in section taken along line AA' in FIG. 3A. The arrow indicates the direction of propagation. FIG. 3B illustrates in a state where oxide cladding is omitted.

The basic construction of this optical modulator will be described. Buried oxide layer 2 is formed on substrate 3. First-conduction-type semiconductor 8 having a rib structure, thin ("thin" denotes submicron order (smaller than 1 μm) hereinafter) dielectric layer 11 and second-conduction-type semiconductor layer 9 are further formed successively thereon. Substrate 3, buried oxide layer 2 and first-conduction-type semiconductor 8 constitute a SOI substrate. First-conduction-type semiconductor 8 will be referred to as "p doped semiconductor". Second-conduction-type semiconductor 9 (hereinafter all referred to as "n doped semiconductor") is further deposited on dielectric layer 11.

The width of n doped semiconductor 9 opposite from dielectric layer 11 is larger than that of the rib structure, partially covering oxide claddings 7. In the portion having the width larger than that of the rib structure, a high-concentration-doped region 10 (hereinafter all referred to as "n+ doped semiconductor") is formed. Electrode contact layer 6 is formed on n+ doped semiconductor 10 on one side and is connected to an external drive circuit or the like through metal electrode 12.

High-concentration-doped regions 4 (hereinafter all referred to as "p+ doped semiconductor") are formed in slab regions on opposite sides of the rib shape. Electrode contact layers 6 are respectively provided on p+ doped semiconductors 4 and are connected to the external drive circuit or the like through metal electrodes 12. The entire waveguide is covered with oxide claddings 7.

In the present invention, the width of the end of n doped semiconductor 9 opposite from dielectric layer 11 is increased relative to that of the rib waveguide to enable use as an electrode lead out layer. Optical loss due to the high-doped layer, i.e., n+ doped semiconductor 10 high-concentration doped for connection to metal electrode 12, can be reduced by forming n+ doped semiconductor 10 in the portion having the width larger than that of the rib waveguide (the portion partially covering oxide claddings 7).

To reduce the magnitude of the optical signal electric field in the high-doped layer, the thickness of p doped semiconductor 8 that extends in the slab region is set to 100 nm or less. This enables disposing high-concentration doped p+ doped semiconductor 4 adjacent to the optical modulation region, so that the series resistance component is reduced; accumulation and removal of carriers are performed at high speed; the size of the optical modulator is reduced; and a speedup and a reduction in power consumption are realized.

Further, according to the present invention, to reduce light absorption loss due to overlap between the high-concentration-doped region and the light field, the waveguide is rib-shaped and p+ doped semiconductors 4 are provided in the slab region. This enables realizing an optical modulator that has a reduced optical loss and a reduced RC time constant and that is capable of high-speed operation. Also, silicon waveguides of a rib structure formed of a SOI layer and having an effective refractive index difference of 5% or less are formed on the front and rear sides of the optical modulator of the present invention in the direction of propagation of light, thereby enabling making an optical connection with markedly high efficiency.

In the optical modulator having the capacitor structure according to the present invention, when an electrical signal is applied as a drive voltage, accumulation, depletion or inversion of carriers is caused on opposite sides of thin dielectric layer 11. However, the thickness of the region in which the carrier density is modulated is estimated to be 100 nm or less. Therefore the region in which the carrier density is modulated is not so large with respect to the extent of the optical signal electric field, and there is a possibility that the modulation efficiency can be further improved.

A structure for further improving the optical modulation efficiency will now be described.

Figure 4:
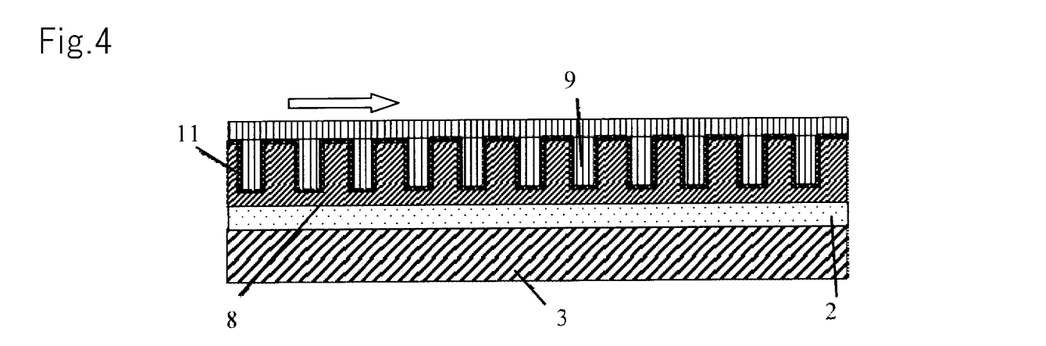
FIG. 4 is a schematic construction diagram of the optical modulator in the first exemplary embodiment in which a recess/projection configuration is provided at the interface of a SIS structure along the direction of propagation of light.

FIG. 4 shows a structure in which a recess/projection configuration is provided at the interface of the SIS structure along the direction of propagation of light. Oxide cladding 7 is omitted.

In the surface of p doped semiconductor 8 in the rib waveguide formed on the SOI substrate, recesses are provided in a direction parallel to the direction of propagation of light (the longitudinal direction of recesses being perpendicular to the direction of propagation of light) to form a recess/projection configuration. The entire portion on the recess/projection configuration is covered with thin dielectric layer 11. On thin dielectric layer 11, n doped semiconductor 9 is deposited.

Thus, the recess/projection configuration is provided at the interface of the SIS structure to increase the overlap between the light field and the carrier density modulation region, so that sufficient ability to perform optical modulation is ensured even if the optical modulation length is small. Therefore the size of the optical modulator can be reduced.

If the thickness of the portion in which carrier modulation is caused in a region in the vicinity of the interface of the SIS structure is W, the maximum depletion layer thickness (the thickness at which carrier modulation is caused) W in thermal equilibrium is given by the following equation.

$$W = 2\sqrt{\frac{\varepsilon_s kT \ln\left(\frac{N_c}{n_i}\right)}{e^2 N_c}} \quad \text{[Expression 4]}$$

In this expression, $\varepsilon_s$ is the dielectric constant of the semiconductor; k, the Boltzmann constant; $N_c$, the carrier density; the intrinsic carrier concentration; e, the amount of electric charge; and T, temperature. For example, when $N_c$ is about $10^{17}/cm^3$, the maximum depletion layer thickness W is about 0.1 µm. With increase in carrier density, the maximum depletion layer thickness W, i.e., the thickness of the region in which modulation of the carrier density is caused, is reduced.

If the pitch between the projection and the recess in each of adjacent-projection-recess combinations is 2W or less, the carrier modulation regions between the adjacent projections and recesses overlap each other and a higher optical modulation effect can be obtained. However, even in a case where the pitch between the projection and the recess in each of adjacent-projection-recess combinations is 2W or more, an effect in improving the optical modulation efficiency can also be obtained.

If the effective refractive index sensed by the optical signal electric field is $n_{eff}$ and the optical signal wavelength is $\lambda$, the light field size is $\lambda/n_{eff}$. Therefore it is desirable that in the optical modulator shown in FIG. 4 the height from the recess to the projection provided in the surface of p doped semiconductor 8 be $\lambda/n_{eff}$ or less. By this setting, the amount of overlap between the light field and the region in which carrier density modulation is performed is maximized to enable realizing effective optical phase modulation.

Further, when a region in which the optical signal electric field has a peak intensity is disposed in the region in which free carriers are accumulated, removed or inverted on the opposite sides of thin dielectric layer 11, the highest optical modulation effect is obtained.

A method of forming the optical modulator of the present invention will be described with reference to FIGS. 5A-5F and FIGS. 6A-6D.

In the process described below, doping for forming first-conduction-type semiconductor 8 as the p-type and doping for forming second-conduction-type semiconductor 9 as the n-type are performed. However, doping for forming first-conduction-type semiconductor 8 as the n-type and doping for forming second-conduction-type semiconductor 9 as the p-type may be performed alternatively.

Figure 5A:
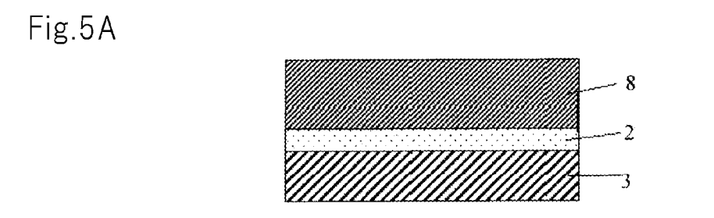
FIG. 5A is a diagram showing a process of manufacturing the optical modulator in the first exemplary embodiment.

FIG. 5A is a sectional view of a SOI substrate used for forming the optical modulator of the present invention. This SOI substrate has a structure in which buried oxide layer 2 is laid on substrate 3, and silicon layer 8 of about 300 nm to 1000 nm (1 µm) is laid thereon. To reduce the optical loss, the thickness of buried oxide layer 2 was set to 1000 nm (1 µm) or more. A substrate doped in advance so that silicon layer 8 on buried oxide layer 2 is of the first conduction type (p-type) may be used, or a surface layer may be doped with boron or indium (phosphorous or arsenic in a case where the conduction type is the n-type) by ion implantation or the like, followed by a heat treatment.

Figure 5B:
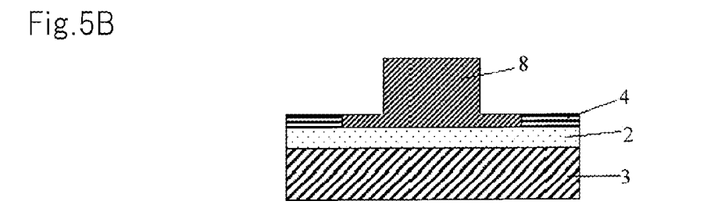
FIG. 5B is a diagram showing the manufacturing process continued from FIG. 5A.

Next, as shown in FIG. 5B, a resist pattern or a hard mask of silica ($SiO_2$) is formed on the surface of p doped semiconductor 8 and processing by reactive etching is performed to the rib shape, thereby forming the waveguide. The thickness of the slab region simultaneously formed is set to 100 nm or less. Regions 4 (p+ doped semiconductor) high-doped with boron or indium are formed by ion implantation in the slab region for electrical contact, followed by heat treatment at about 1050° C. for recovering crystallinity.

Figure 5C:
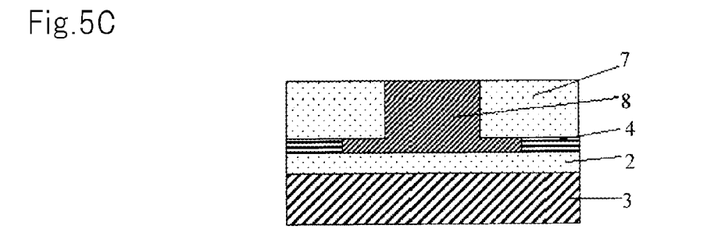
FIG. 5C is a diagram showing the manufacturing process continued from FIG. 5B.

Next, as shown in FIG. 5C, 300 nm to 700 nm thick silica film is laid as oxide cladding 7 and is flattened by CMP (chemical-mechanical polishing process) or the like so that the upper surface of the rib-shaped portion of p doped semiconductor 8 is exposed.

Figure 5D:
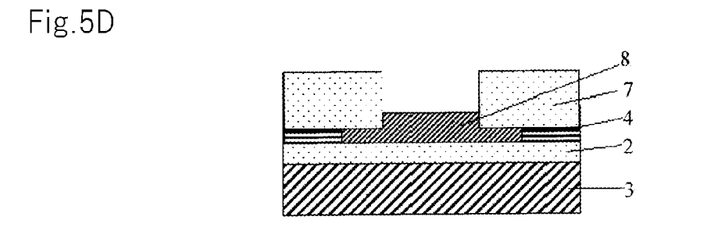
FIG. 5D is a diagram showing the manufacturing process continued from FIG. 5C.

Next, as shown in FIG. 5D, the rib-shaped portion of p-doped semiconductor 8 is etched by reactive etching to reduce the height of the rib-shaped portion. In a case where the surface of p doped semiconductor 8 is formed flat without any recess/projection configuration along the direction of propagation of light as shown in FIG. 3B, only etching may be performed. In a case where a recess/projection configuration is provided in the surface of p doped semiconductor 8 as shown in FIG. 4, a resist mask pattern is formed so as to have spaces corresponding to the pitch between the recesses and the projections in the recess/projection configuration formed on p doped semiconductor 8, and etching is thereafter performed to form the recess/projection configuration while reducing the height of the rib-shaped portion of p doped semiconductor 8. On completion of this process, grooves are formed by the upper surface (etched surface) of p doped semiconductor 8 and side surfaces of oxide claddings 7.

Figure 5E:
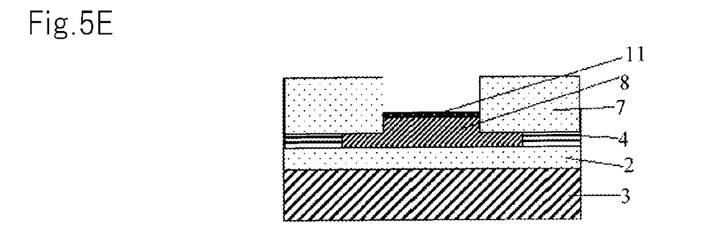
FIG. 5E is a diagram showing the manufacturing process continued from FIG. 5D.

Next, the mask layer used for the above-described patterning is removed (only in the case of forming the recesses and the projections). Thereafter, as shown in FIG. 5E, a silicon oxide layer provided as dielectric layer 11 is formed to a thickness of about 1 nm to 20 nm on p doped semiconductor layer 8 by a thermal oxidation process. Dielectric layer 11 may be formed of at least one layer: a silicon oxide layer, a silicon nitride layer or any other high-k insulating layer and may be determined by considering the modulation efficiency and the electrical capacity of the optical modulator.

Figure 5F:
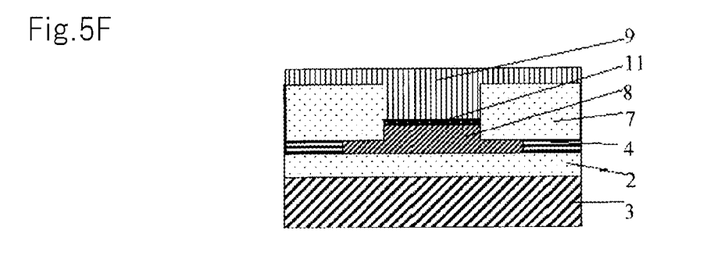
FIG. 5F is a diagram showing the manufacturing process continued from FIG. 5E.

Next, as shown in FIG. 5F, polycrystalline silicon layer 9 is sufficiently deposited in the grooves on dielectric layer 11 by CVD or sputtering, and polycrystalline silicon layer 9 is further deposited so as to also cover the surfaces of oxide claddings 7 in order that polycrystalline silicon layer 9 will form an electrode lead out layer.

In the case where the recess/projection configuration is provided at the interface of the SIS structure, a similar recess/projection configuration is also formed on polycrystalline silicon 9 due to the recess/projection configuration of dielectric layer 11. Such a recess/projection configuration on polycrystalline silicon 9 acts as a cause of a light scatter loss at the time of transmission of an optical signal. Therefore it is desirable to flatten the recess/projection configuration by CMP. Also, the above-described polycrystalline layer 9 is doped during film forming so as to be of the second conduction type (n-type) or is doped with phosphorous or arsenic by ion implantation after film forming In the case where first-conduction-type semiconductor 8 is of the n-type, polycrystalline silicon layer 9 is to be of the p-type.

Figure 6A:
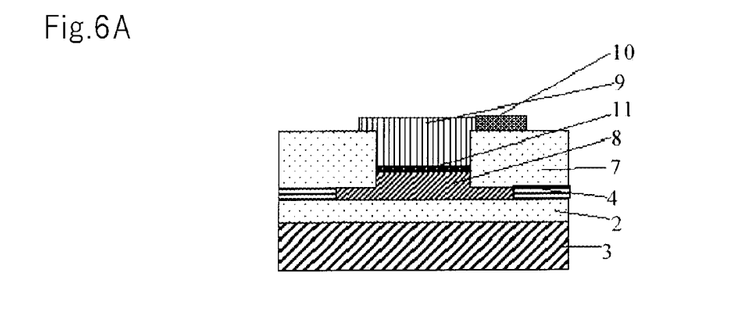
FIG. 6A is a diagram showing the manufacturing process continued from FIG. 5F.

Next, as shown in FIG. 6A, patterning by reactive plasma etching or the like is performed on n doped semiconductor 9 so that the portion of p doped semiconductor 9 formed as a layer above oxide claddings 7, i.e., the electrode lead out layer, has a width that is 0.3 µm to 2 µm, larger than that of the rib waveguide. Thereafter, the surface layer of n doped semiconductor 9 projecting along the width direction of the rib waveguide (along the direction perpendicular to the direction of propagation of light) is doped with phosphorous or arsenic by ion implantation or the like to provide n+ doped semiconductor 10 high-concentration doped, thereby reducing the resistance of the surface layer.

Figure 6B:
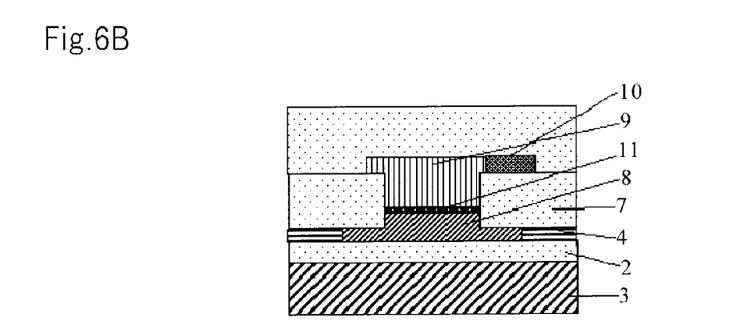
FIG. 6B is a diagram showing the manufacturing process continued from FIG. 6A.

Further, as shown in FIG. 6B, n doped semiconductor 9 and n+ doped semiconductor 10 are covered with oxide cladding 7, followed by flattening by CMP.

Figure 6C:
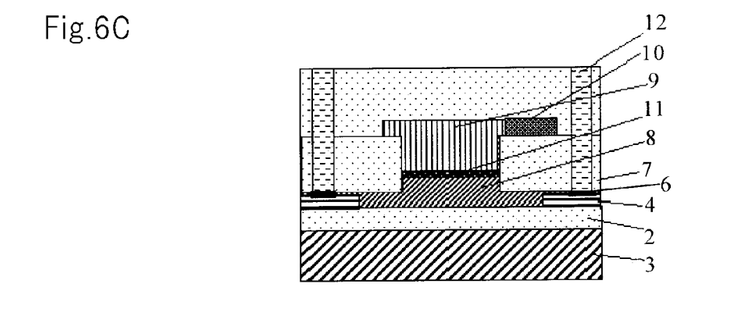
FIG. 6C is a diagram showing the manufacturing process continued from FIG. 6B.

Next, as shown in FIG. 6C, contact holes for leading out electrodes are formed by reactive etching and a nickel silicide layer is formed as electrode contact layer 6 on p+ doped semiconductor 9. Further, metal electrodes 12 formed of TaN/Al(Cu) or the like are formed so as to fill the contact holes.

Figure 6D:
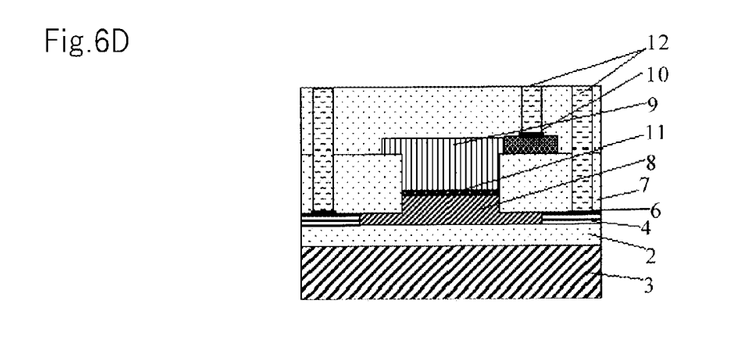
FIG. 6D is a diagram showing the manufacturing process continued from FIG. 6C.

Finally, as shown in FIG. 6D, a contact hole for leading out an electrodes is formed by the same procedure as that described above and a nickel silicide layer is formed as electrode contact layer 6 on the n+ doped semiconductor. Metal electrode 12 formed of TaN/Al(Cu) or the like is formed so as to fill the contact hole and connections to a drive circuit are made.

Each of the first-conduction-type semiconductor and the second-conduction-type semiconductor is constituted by at least one layer selected from a group consisting of polycrystalline silicon, amorphous silicon, strained silicon, monocrystalline Si and $Si_xGe_{(1-x)}$.

Because the portions of oxide claddings 7 in contact with the side surfaces of p doped semiconductor 8, i.e., the inner walls of oxide claddings 7, are formed along the shape of p doped semiconductor 8, no roughness due to crystal grains exists therein and the degree of flatness thereof is high in comparison with a surface obtained by working polysilicon. Also, because n-doped semiconductor 9 is formed between the inner walls of oxide claddings 7 having a high degree of flatness, the roughness of the side surfaces of n doped semiconductor 9 in contact with oxide claddings 7 is reduced and the flatness thereof is markedly high. In the rib waveguide structure of the present invention, therefore, the roughness of the portions constituting the rib shape is reduced, so that optical transmission loss can be remarkably reduced.

The inner walls of oxide claddings 7 extend along the side surface of the rib-shaped portion of p doped semiconductor 8 in the direction opposite from the direction toward substrate 3, and n doped semiconductor 9 is formed between oxide claddings 7. Therefore n doped semiconductor 9 can be disposed at the same position as the upper surface of the rib-shaped portion of p doped semiconductor 8, with dielectric layer 11 interposed therebetween, thereby avoiding the problem of misalignment between p-doped semiconductor 8 and n doped semiconductor 9 and enabling the optical modulator to be made in a short time at a low cost.

It is preferable that the effective refractive index of n doped semiconductor 9 be smaller than that of p doped semiconductor 8 by 10% or more.

Figure 7:
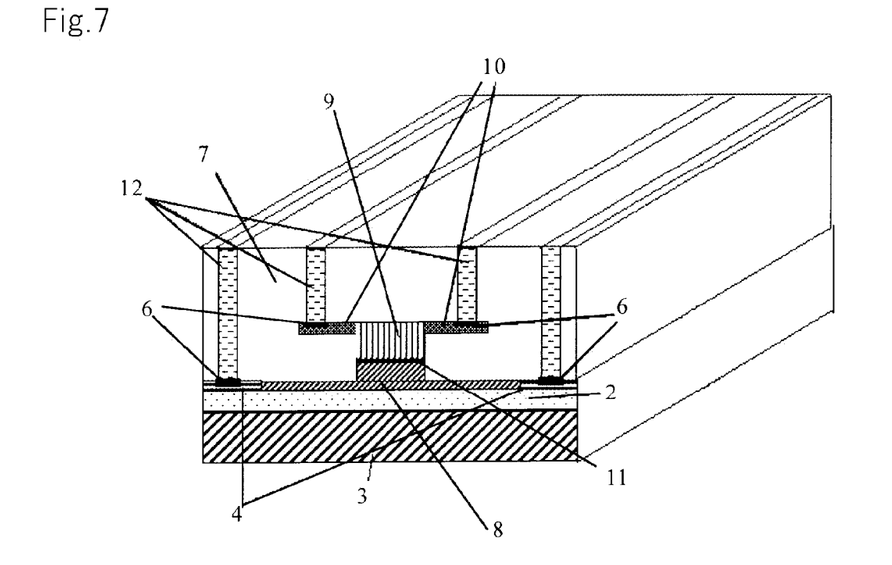
FIG. 7 is a schematic construction diagram of a second exemplary embodiment of the optical modulator according to the present invention.

FIG. 7 is a schematic construction diagram of a second exemplary embodiment of the optical modulator according to the present invention. The description of the same components as those in the above-described exemplary embodiment will not be repeated.

In the present exemplary embodiment, both two portions of n doped semiconductor 9 by which the width of n doped semiconductor 9 is increased relative to that of the rib structure at the side opposite from dielectric layer 11 are high-concentration doped to form n+ doped semiconductors 10, and electrode contact layers 6 are provided on the two n+ doped semiconductors 10 and are connected to an external drive circuit or the like through metal electrodes 12. Optical loss due to the high-concentration-doped region (n+ doped semiconductor 10) can be reduced by forming n+ doped semiconductor 10 in the opposite-side portions of n doped semiconductor 9 whose width is increased relative to that of the rib structure. By doing so, the series resistance component and, hence, the RC time constant can be further reduced. Also, optical modulation efficiency can be further improved by providing a recess/projection configuration at the interface of the SIS structure along the direction of propagation of light, as in the case of the above-described exemplary embodiment.

Figure 8:
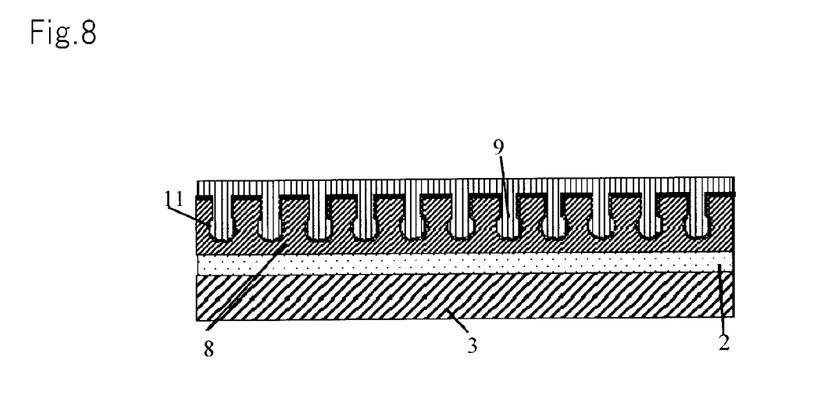
FIG. 8 is a schematic construction diagram of a third exemplary embodiment of the optical modulator according to the present invention.

FIG. 8 is a schematic construction diagram of a third exemplary embodiment of the optical modulator according to the present invention. The description of the same components as those in the above-described exemplary embodiments will not be repeated.

The basic construction is the same as that in the above-described first or second exemplary embodiment. A recess/projection configuration is provided at the interface of the SIS structure along the direction of propagation of light. Further, in the present exemplary embodiment, the bottom of the cavity of each recess in the recess/projection configuration is formed into a shape with a curvature to improve the overlap between the optical signal electric field and the region in which the carrier density is modulated, thus enabling obtaining higher modulation efficiency. Forming the bottom of the cavity of each recess in the recess/projection configuration into a shape with a curvature enables modulation of the carrier density at a lower voltage.

Figure 9:
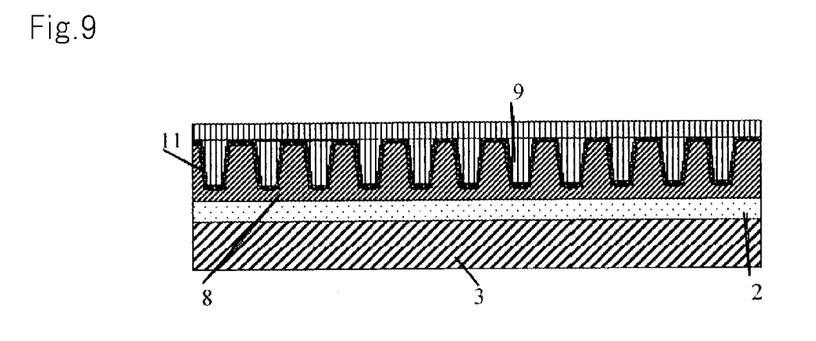
FIG. 9 is a schematic construction diagram of a fourth exemplary embodiment of the optical modulator according to the present invention.

FIG. 9 is a schematic construction diagram of a fourth exemplary embodiment of the optical modulator according to the present invention. The description of the same components as those in the above-described exemplary embodiments will not be repeated.

The basic construction is the same as that in the above-described first or second exemplary embodiment. A recess/projection configuration is provided at the interface of the SIS structure along the direction of propagation of light. Further, in the present exemplary embodiment, each projection in the recess/projection configuration has a tapered shape such that its width decreases as the projection becomes narrower from its base towards its extreme end. The overlap between the optical signal electric field and the region in which the carrier density is modulated is improved in this way, so that higher modulation efficiency can be obtained. Also, in the direction of propagation of light, the extreme end of each projection of p doped semiconductor 8 in the recess/projection configuration is thinner while the based end of the projection is thicker. Accordingly, the base end (corresponding to the recess of p doped semiconductor 8) of n doped semiconductor 9 embedded in the recess formed in p doped semiconductor 8 is thicker than the extreme end, so that the resistance thereof is reduced, which is advantageous for performing a high-speed operation.

Figure 10:
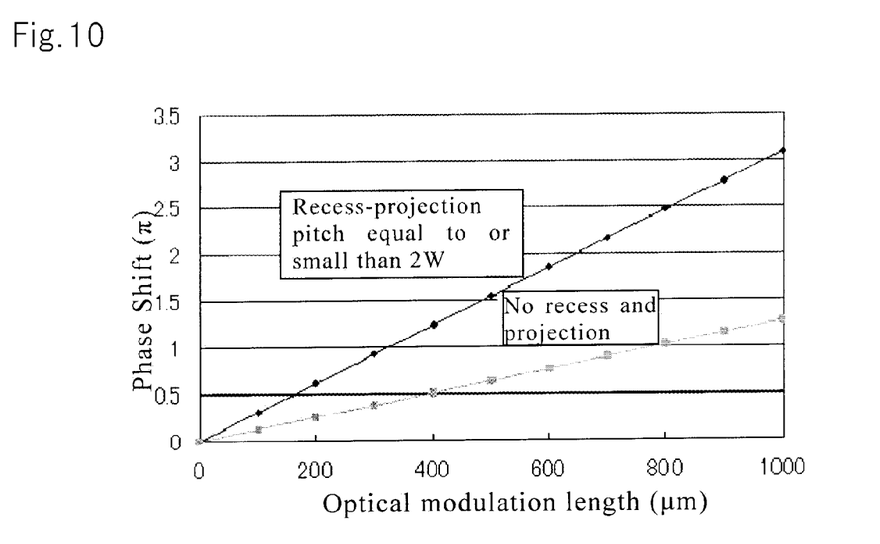
FIG. 10 is a diagram showing the relationship between the optical modulation length and the amount of optical phase shift with respect to a case where a recess/projection configuration was formed at the interface of the SIS structure and a case where no recess/projection configuration was formed.

A dependence of the amount of phase shift on the length in the optical signal propagation direction in the optical modulator of the present invention was examined with respect to the case where the recess/projection configuration was provided at the interface of the SIS structure and with respect to the case where no recess/projection configuration was provided. The pitch between the recesses and the projections in the recess/projection configuration was set to 160 nm or less. FIG. 10 shows an example of test results.

From the fact that the amount of phase shift is increased by forming a recess/projection configuration in which the pitch between the recesses and the projections is about 160 nm or less, substantially equal to the thickness at which carrier modulation is performed, it can be understood that if a recess/projection configuration is formed at the interface of the SIS structure in the optical modulator of the present invention, the optical modulation efficiency will be further improved. The optical modulator of the present invention has an increased amount of phase shift in comparison with the optical modulators of the related art regardless of the existence/nonexistence of a recess/projection configuration at the interface of the SIS structure, through this comparison is not illustrated.

Figure 11:
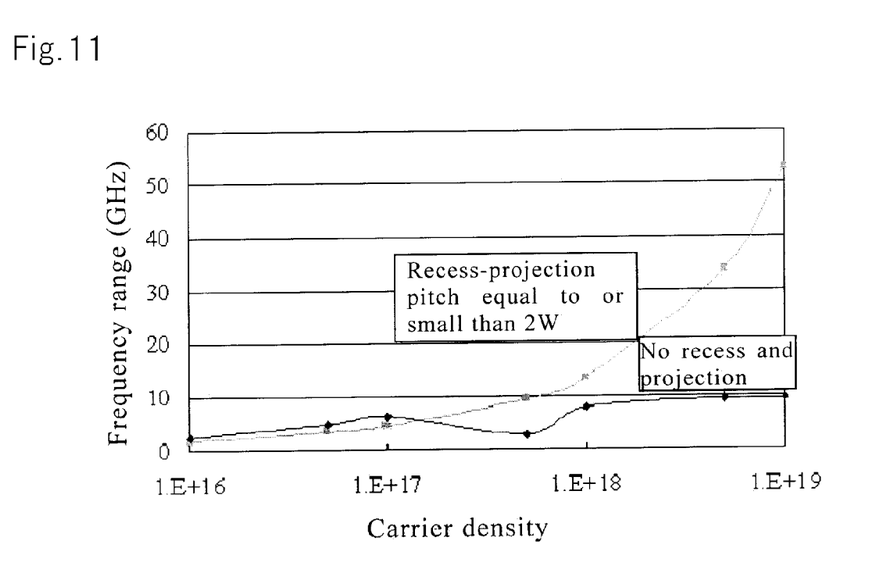
FIG. 11 is a distribution map showing the relationship between the carrier density and the frequency range with respect to the case where a recess/projection configuration was formed at the interface of the SIS structure and the case where no recess/projection configuration was formed.

The relationship between the carrier density and the optical modulation operating frequency range in the optical modulator of the present invention was examined with respect to the case where the recess/projection configuration was provided at the interface of the SIS structure and with respect to the case where no recess/projection configuration was provided. In relation to the optical modulation operating frequency range, there is a tradeoff between the effect of reducing the size by improving the modulation efficiency and the influence of an increase in electrical capacity due to the provision of the recess/projection configuration. In the case where the pitch between the recesses and the projections in the recess/projection configuration was 160 nm or less, the optical modulation operating frequency range was broadened when the height from the recess to the projection was $\lambda/n_{eff}$ or less, where $n_{eff}$ is the effective refractive index sensed by the optical signal electric field and $\lambda$ is the optical signal wavelength.

As can be understood from the test results shown in FIG. 11, the optical modulation operating frequency range is increased to 10 GHz or higher by setting the carrier density to about $10^{18}/cm^3$. High-speed operation is enabled thereby.

In addition to the above, the mobility and the lifetime of carriers are very important in improving the frequency range. In particular, the mobility of carriers in the polycrystalline silicon layer is a factor that needs to be considered in order to achieve a high-speed operation. It is, therefore, effective to improve the carrier mobility by increasing the grain size of polycrystalline silicon through recrystallization by annealing or to improve the crystalline quality of polycrystalline silicon by using an epitaxial lateral growth (ELO) method or the like with respect to the second-conduction-type semiconductor layer.

Figure 12A:
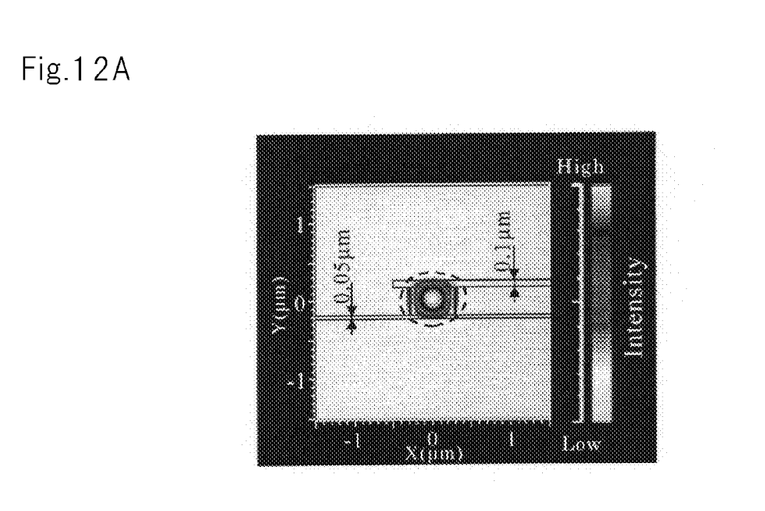
FIG. 12A is a distribution map showing a light field distribution in a case where the thickness of a slab region in the optical modulator of the present invention was reduced.
Figures 12B, 13:
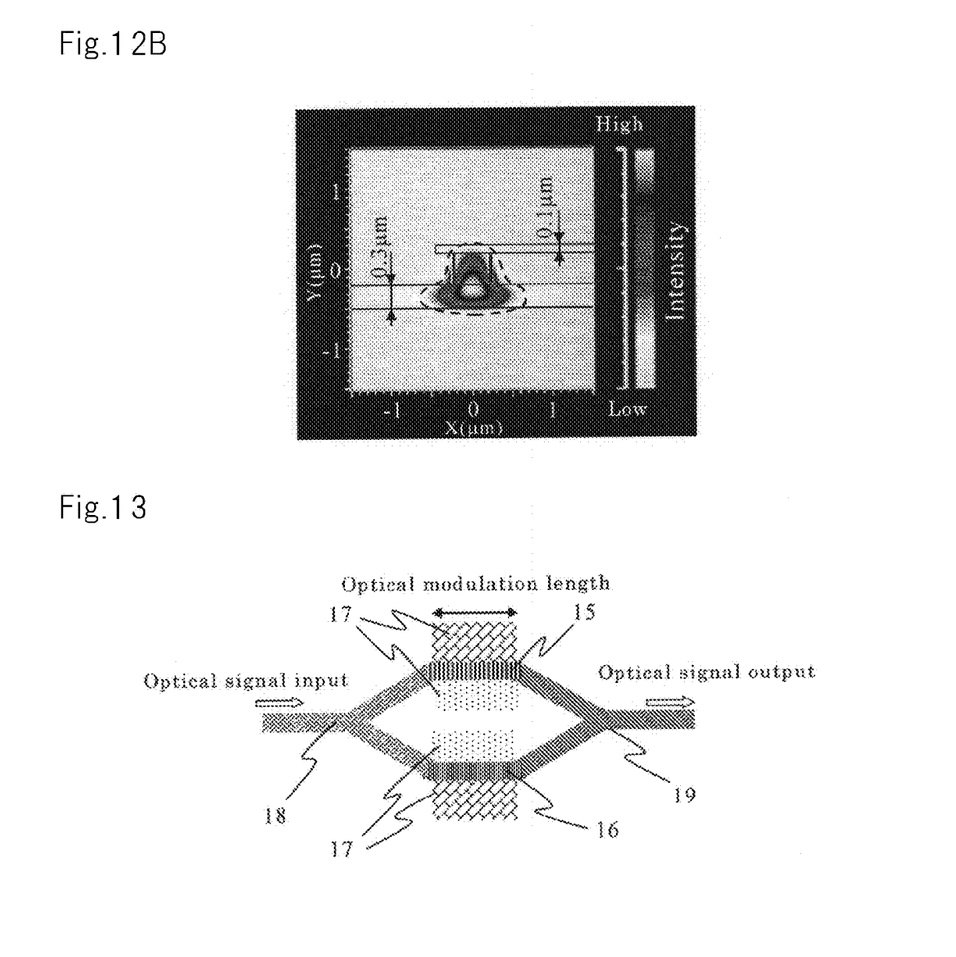
FIG. 12B is a diagram showing a light field distribution in a case where the thickness of a slab region in the optical modulator of the present invention was increased.
FIG. 13 is a schematic construction diagram of a Mach-Zehnder interferometer type of light intensity modulator using the optical modulator of the present invention.

The difference in light field distribution between a case where the thickness of p doped semiconductor 8 that extends in the slab region was small and a case where the thickness of p doped semiconductor 8 that extends in the slab region was large was examined in the optical modulator of the present invention. FIG. 12A is a distribution map of a light field distribution in a case where the thickness of p doped semiconductor 8 that extends in the slab region is small, and FIG. 12B is a distribution map of a light field distribution in a case where the thickness of p doped semiconductor 8 that extends in the slab region is large. Each distribution map shows a state of propagation of light in a perpendicular cross-section of the optical modulator. The intensities of light that passes through portions of the optical waveguide are expressed by light and shade. The direction of propagation of light in the figure is a front-rear direction. The rectangular region extending from −1.5 to 1.5 along the X-axis as shown in the figure is a slab region that contains p doped semiconductor 8. The rectangular region extending from −0.5 to 1.5 along the X-axis as shown in the figure is a region that contains n+ doped semiconductor 10 high-concentration doped for connection to metal electrode 12. The rib-shaped waveguide is formed from the slab region toward the region that contains n+ doped semiconductor.

The region surrounded by the broken line, difficult to see in FIGS. 12A and 12B, is a region through which light passed. With approach toward the center of the region indicated by the broken line, the intensity of light increases.

As shown in FIG. 12A, in the case where the thickness of the slab region is small, the light field is circularly concentrated on the center of the rib waveguide. From this, it can be understood that light is modulated highly efficiently. On the other hand, as shown in FIG. 12B, in the case where the thickness of the slab region is large, the center of the light field deviates from the center of the rib waveguide and the light field extends in the slab region. From this, it can be understood that the optical modulation efficiency is reduced in comparison with the case where the thickness of the slab region is small. Thus, the optical modulation efficiency can be further improved by reducing the thickness of the slab region.

An example of application of the optical modulator of the present invention will be further described.

FIG. 13 shows the structure of a Mach-Zehnder interferometer type of light intensity modulator that uses the optical modulator of the present invention. A light intensity modulation signal can be obtained by using a Mach-Zehnder interferometer and by causing interference between phase differences in two arms of the Mach-Zehnder interferometer.

The light intensity modulator has a first arm 15 and a second arm 16 that are formed by the optical modulators and that are disposed parallel to each other. An optical branching structure 18 for branching at the input side of the optical modulator and an optical coupling structure 19 for coupling at the output side of the optical modulator are connected. Lights branching at optical branching structure 18 undergo phase modulation in first arm 15 and second arm 16, and phase interference is caused in the optical coupling structure, thus making conversion into a light intensity modulation signal.

In the present exemplary embodiment, the optical branching structure 18 provided on the input side causes light that has been input to separate into lights having powers equal to each other in first and second arms 15 and 16. By applying a plus voltage to the first arm 15 through electrode pads 17, carrier accumulation occurs on the opposite sides of dielectric layer 11 in the optical modulator. By applying a minus voltage to second arm 16, carrier on the opposite sides of dielectric layer 11 in the optical modulator are removed. Thus, in the carrier accumulation mode, the refractive index sensed by the optical signal electric field in the optical modulator is reduced. In the carrier removal (depletion) mode, the refractive index sensed by the optical signal electric field is increased. As a result, the difference between the phases of the optical signals in the two arms is maximized The optical signals transmitted through these two arms are combined by the optical coupling structure on the output side to cause light intensity modulation. It was confirmed that the Mach-Zehnder-interferometer-type light intensity modulator using the optical modulator of the present invention was capable of transmitting an optical signal at 20 Gbps or more.

The Mach-Zehnder interferometer type light intensity modulator using the optical modulator can also be applied to an optical modulator, a matrix optical switch or the like having a higher transfer rate by disposing a plurality of the light intensity modulators that have the Mach-Zehnder interferometer structure in parallel or series with each other.

Further, as described above, an optical connection can be made with markedly high efficiency by forming and connecting silicon waveguides of a rib structure formed of a SOI layer and having an effective refractive index difference of 5% or less on the front and rear sides of the optical modulator of the present invention in the direction of propagation of light. That is, the light intensity can be modulated more efficiently by setting to 5% or less the difference between the effective refractive index of first arm 15 and second arm 16 and the effective refractive index of the silicon waveguides in optical branching structure 18 and optical coupling structure 17 connected to first and second arms 15 and 16.

The whole or part of the exemplary embodiments disclosed above can be described as, but not limited to, the following supplementary notes.

(Supplementary Note 1)

An optical modulator including at least a semiconductor layer having a rib-shaped portion and doped so as to be of a first conduction type, a dielectric layer laid on the first-conduction-type semiconductor layer, and a semiconductor layer laid on the dielectric layer, having the width at the side opposite from the dielectric layer increased relative to the width of the rib-shaped portion, and doped so as to be of a second conduction type.

(Supplementary Note 2)

The optical modulator according to Supplementary note 1, wherein the portion of the second-conduction-type semiconductor layer opposite from the dielectric layer and having a width larger than the width of the rib-shaped portion is high-concentration doped.

(Supplementary Note 3)

The optical modulator according to Supplementary note 1 or 2, wherein a recess/projection configuration parallel to the direction of propagation of an optical signal is formed in the rib-shaped portion of the first-conduction-type semiconductor layer.

(Supplementary Note 4)

The optical modulator according to Supplementary note 3, wherein the pitch between recesses and projections in the recess/projection configuration provided in the surface of the first-conduction-type semiconductor layer is equal to or smaller than 2W with respect to the thickness W of a region in which free carriers are accumulated, removed or inverted in the first-conduction-type semiconductor layer and the second-conduction-type semiconductor layer on opposite sides of the dielectric layer.

(Supplementary Note 5)

The optical modulator according to Supplementary note 3 or 4, wherein the height from the recess to the projection in the recess/projection configuration provided in the surface of the first-conduction-type semiconductor layer is $\lambda/n_{\it eff}$ or less, where $n_{\it eff}$ is the effective refractive index sensed by an optical signal electric field in the optical modulator and X, is the optical signal wavelength.

(Supplementary Note 6)

The optical modulator according to any one of Supplementary notes 3 to 5, wherein the bottom surface of a cavity of each recess in the recess/projection configuration in the surface of the first-conduction-type semiconductor layer is formed into a shape with a curvature.

(Supplementary Note 7)

The optical modulator according to any one of Supplementary notes 3 to 5, wherein each projection in the recess/projection configuration in the surface of the first-conduction-type semiconductor layer has a tapered shape such that its width decreases as the projection becomes narrower from the base of the projection toward the extreme end of the projection.

(Supplementary Note 8)

The optical modulator according to any one of Supplementary notes 1 to 7, wherein a region in which an optical signal electric field has a peak intensity is disposed in a region in which free carriers are accumulated, removed or inverted on opposite sides of the dielectric layer.

(Supplementary Note 9)

The optical modulator according to any one of Supplementary notes 1 to 8, wherein the effective refractive index of the second-conduction-type semiconductor layer is smaller by 10% or more than the effective refractive index of the first-conduction-type semiconductor layer.

(Supplementary Note 10)

The optical modulator according to any one of Supplementary notes 1 to 9, wherein the thickness of a slab region other than the rib-shaped portion in the first-conduction-type semiconductor layer is 100 nm or less.

(Supplementary Note 11)

The optical modulator according to any one of Supplementary notes 1 to 10, wherein the first-conduction-type semiconductor layer and the second-conduction-type semiconductor layer, respectively, is composed of at least one layer of polycrystalline silicon, amorphous silicon, strained silicon, monocrystalline Si and $Si_xGe_{(1-x)}$.

(Supplementary Note 12)

The optical modulator according to any one of Supplementary notes 1 to 11, wherein the difference between the effective refractive indices of the optical modulator and a waveguide connected to the optical modulator is 5% or less.

(Supplementary Note 13)

A light intensity modulator using the optical modulator according to any one of Supplementary notes 1 to 11, the light intensity modulator having a Mach-Zehnder interferometer structure that includes a first arm and a second arm in each of which the optical modulator is disposed, an optical branching structure coupled to input sides of the first arm and the second arm, and an optical coupling structure coupled to output sides of the first arm and the second arm.

(Supplementary Note 14)

The light intensity modulator according to Supplementary note 13, wherein the optical branching structure sets an input signal distribution ratio of 1:1 for the first arm and the second arm.

(Supplementary Note 15)

The light intensity modulator according to Supplementary note 13 or 14, wherein a plurality of the Mach-Zehnder interferometer structures are disposed in parallel or series with each other.

(Supplementary Note 16)

The light intensity modulator according to any one of Supplementary notes 13 to 15, wherein the difference between the effective refractive index of the optical modulators used in the first arm and the second arm and the effective refractive index of waveguides in the optical branching structure and the optical coupling structure is 5% or less.

(Supplementary Note 17)

A method of manufacturing an optical modulator, comprising at least the steps of providing a rib-shaped portion on a semiconductor layer doped so as to be of a first conduction type, depositing an oxide cladding to an upper surface of the rib-shaped portion along side surfaces of the rib-shaped portion, etching the rib-shaped portion of the first-conduction-type semiconductor layer so that the height of the rib-shaped portion is reduced, providing a dielectric layer on an upper surface of the first-conduction-type rib-shaped portion reduced in height, and covering a surface of the oxide cladding and grooves formed by the dielectric layer and side surfaces of the oxide cladding with a semiconductor layer doped so as to be of a second conduction type.

(Supplementary Note 18)

The method of manufacturing an optical modulator according to Supplementary note 17, wherein the height of the rib-shaped portion is reduced by etching the rib-shaped portion of the first-conduction-type semiconductor layer, and a projection/recess configuration is formed in a surface of the rib-shaped portion of the first-conduction-type semiconductor layer in a direction parallel to the direction of propagation of an optical signal.

(Supplementary Note 19)

The method of manufacturing an optical modulator according to Supplementary note 18, wherein the pitch between recesses and projections in the recess/projection configuration formed in the surface of the first-conduction-type semiconductor layer is set equal to or smaller than 2W with respect to the thickness W of a region in which free carriers are accumulated, removed or inverted in the first-conduction-type semiconductor layer and the second-conduction-type semiconductor layer on opposite sides of the dielectric layer.

(Supplementary Note 20) The method of manufacturing an optical modulator according to Supplementary note 18 or 19, wherein the height from the recess to the projection in the recess/projection configuration formed in the surface of the first-conduction-type semiconductor layer is set to $\lambda/n_{eff}$ or less, where $n_{eff}$ is the effective refractive index sensed by an optical signal electric field in the optical modulator and $\lambda$ is the optical signal wavelength.

(Supplementary Note 21)

The method of manufacturing an optical modulator according to any one of Supplementary notes 17 to 20, wherein a region in which an optical signal electric field has a peak intensity is disposed in a region in which free carriers are accumulated, removed or inverted on opposite sides of the dielectric layer.

(Supplementary Note 22)

The method of manufacturing an optical modulator according to any one of Supplementary notes 17 to 21, wherein a portion of the second-conduction-type semiconductor layer covering the surface of the oxide cladding is high-concentration doped.

(Supplementary Note 23)

A method of manufacturing a light intensity modulator using the optical modulator according to any one of Supplementary notes 1 to 11, including disposing the optical modulator in a first arm and a second arm of a Mach-Zehnder interferometer structure, connecting an optical branching structure to input sides of the first arm and the second arm, and connecting an optical coupling structure to output sides of the first arm and the second arm.

This application is based upon and claims the benefit of priority from the prior Japanese Application No. 2010-049175, filed on Mar. 5, 2010; the entire contents of which are incorporated herein by reference.

REFERENCE SIGNS LIST

2 Buried oxide layer
3 Substrate
4 p+ doped semiconductor
6 Electrode contact layer
7 Oxide cladding
8 p doped semiconductor (first-conduction-type semiconductor)
9 n doped semiconductor (second-conduction-type semiconductor)
10 n+ doped semiconductor
11 Dielectric layer
12 Metal electrode
15 First arm
16 Second arm
17 Electrode pad
18 Optical branching structure 19 Optical coupling structure
31 Intrinsic semiconductor layer
32 Buried oxide layer
33 Substrate
34 p+ doped semiconductor
35 n+ doped semiconductor
36 Electrode contact layer
37 Oxide cladding
38 p doped semiconductor
39 n doped semiconductor
41 Dielectric layer

The invention claimed is:

1. An optical modulator comprising at least:
a semiconductor layer having a rib-shaped portion and doped so as to be of a first conduction type;
a dielectric layer laid on said first-conduction-type semiconductor layer; and
a semiconductor layer laid on said dielectric layer, having the width at the side opposite from said dielectric layer increased relative to the width of the rib-shaped portion, and doped so as to be of a second conduction type.

2. The optical modulator according to claim 1, wherein the portion of said second-conduction-type semiconductor layer opposite from said dielectric layer and having a width larger than the width of the rib-shaped portion is high-concentration doped.

3. The optical modulator according to claim 1, wherein a recess/projection configuration parallel to the direction of propagation of an optical signal is formed in the rib-shaped portion of said first-conduction-type semiconductor layer.

4. The optical modulator according to claim 3, wherein the pitch between recesses and projections in the recess/projection configuration provided in the surface of said first-conduction-type semiconductor layer is equal to or smaller than 2W with respect to the thickness W of a region in which free carriers are accumulated, removed or inverted in said first-conduction-type semiconductor layer and said second-conduction-type semiconductor layer on opposite sides of said dielectric layer.

5. The optical modulator according to claim 3, wherein the height from the recess to the projection in the recess/projection configuration provided in the surface of said first-conduction-type semiconductor layer is $\lambda/n_{eff}$ or less, where $n_{eff}$ is the effective refractive index sensed by an optical signal electric field in the optical modulator and $\lambda$ is the optical signal wavelength.

6. The optical modulator according to claim 3, wherein the bottom surface of a cavity of each recess in the recess/projection configuration in the surface of said first-conduction-type semiconductor layer is formed into a shape with a curvature.

7. The optical modulator according to claim 3, wherein each projection in the recess/projection configuration in the surface of said first-conduction-type semiconductor layer has a tapered shape such that its width decreases as the projection becomes narrower from the base of the projection toward the extreme end of the projection.

8. A light intensity modulator using the optical modulator according to claim 1, the light intensity modulator comprising a Mach-Zehnder interferometer structure including a first arm and a second arm in each of which the optical modulator is disposed, an optical branching structure coupled to input sides of the first arm and the second arm, and an optical coupling structure coupled to output sides of the first arm and the second arm.

9. The optical modulator according to claim 1, wherein a region in which an optical signal electric field has a peak intensity is disposed in a region in which free carriers are accumulated, removed or inverted on opposite sides of the dielectric layer.

10. The optical modulator according to claim 1, wherein the effective refractive index of the second-conduction-type semiconductor layer is smaller by 10% or more than the effective refractive index of the first-conduction-type semiconductor layer.

11. The optical modulator according to claim 1, wherein the thickness of a slab region other than the rib-shaped portion in the first-conduction-type semiconductor layer is 100 nm or less.

12. The optical modulator according to claim 1, wherein the difference between the effective refractive indices of the optical modulator and a waveguide connected to the optical modulator is 5% or less.

13. The light intensity modulator according to claim 8, wherein the optical branching structure sets an input signal distribution ratio of 1:1 for the first arm and the second arm.

14. The light intensity modulator according to claim 8, wherein a plurality of the Mach-Zehnder interferometer structures are disposed in parallel or series with each other.

* * * * *